US009774467B2

(12) United States Patent
Fabre et al.

(10) Patent No.: US 9,774,467 B2
(45) Date of Patent: Sep. 26, 2017

(54) DISTRIBUTED INTELLIGENT MODULES SYSTEM USING POWER-LINE COMMUNICATION FOR ELECTRICAL APPLIANCE AUTOMATION

(71) Applicant: Ecole Polytechnique Fédérale de Lausanne (EPFL), Lausanne (CH)

(72) Inventors: Laurent Fabre, Lausanne (CH); Maher Kayal, Saint-Sulpice (CH); Fabrizio Lo Conte, Lausanne (CH); Thierry Barras, Gilly (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 0 days.

(21) Appl. No.: 14/904,974

(22) PCT Filed: Jul. 25, 2013

(86) PCT No.: PCT/IB2013/056117
§ 371 (c)(1),
(2) Date: Jan. 14, 2016

(87) PCT Pub. No.: WO2015/011528
PCT Pub. Date: Jan. 29, 2015

(65) Prior Publication Data
US 2016/0164695 A1 Jun. 9, 2016

(51) Int. Cl.
*H04L 1/00* (2006.01)
*H04L 12/28* (2006.01)
(Continued)

(52) U.S. Cl.
CPC ........ *H04L 12/2807* (2013.01); *G01R 21/133* (2013.01); *H04B 3/54* (2013.01);
(Continued)

(58) Field of Classification Search
CPC ..... Y04S 20/225; H04W 52/02; H04W 24/00; G06K 15/4055; G06F 1/3203;
(Continued)

(56) References Cited

U.S. PATENT DOCUMENTS 5,491,785 A * 2/1996 Robson ............. G06F 17/30014
340/7.52
5,504,818 A * 4/1996 Okano .................... H04L 9/088
713/166

(Continued)

FOREIGN PATENT DOCUMENTS

EP 1978689 10/2008
WO WO2011/094873 8/2011

OTHER PUBLICATIONS

International Search Report (ISR) of Apr. 4, 2014 prepared for priority application PCT/IB2013/056117.

*Primary Examiner* — Dady Chery
(74) *Attorney, Agent, or Firm* — Andre Roland S.A.; Nikolaus Schibli

(57) ABSTRACT

In a first aspect the invention provides a system that comprising a plurality of electronic modules, each one of the electronic modules configured for enabling automation of an electrical appliance to be connected to the electronic module. Each electronic module comprises at least a communication sub-part configured to enable communication over a power-line network with other modules, at least an acting means configured to act on an electrical voltage to be applied to the electrical appliance, at least a measurement means configured to measure a power consumption to be consumed by the electrical appliance, and an embedded intelligence means configured to process signals providing from or going to the at least one communication sub-part, the at least one acting means and the at least one measurement means. Each (Continued)

one of the plurality of electronic modules is enabled for communication with the others of the plurality of electronic modules over the power-line network by means of its at least one communication sub-part. In each one of the plurality of electronic modules the embedded intelligence means further comprises outgoing message sending means configured to send an outgoing message over the power-line network to at least one of the others of the plurality of electronic modules, ingoing message receiving means configured to receive an ingoing message over the power-line network from at least one of the others of the plurality of electronic modules, identifying means configured to identify an ingoing message relevant to the electronic module, presentation means configured to prepare a presentation message to be sent as outgoing message, the presentation message containing presentation information related to an identity of the electronic module, hierarchical ordering means configured to generate an ordered list of the plurality of modules that comprises the electronic module and the others of the plurality of electronic modules, depending on presentation information from the electronic module and presentation information received from the others of the plurality of electronic modules, and electing means for electing from the ordered list a president electronic module. The presentation means, the hierarchical ordering means and the electing means are configured such that the electing means in each of the plurality of electronic modules find the same president electronic module. The embedded intelligence means are further configured to handle information included an ingoing message sent from the president electronic module according to a determined priority protocol.

13 Claims, 3 Drawing Sheets

(51) Int. Cl.
  *H04B 3/54* (2006.01)
  *H04L 12/417* (2006.01)
  *G01R 21/133* (2006.01)

(52) U.S. Cl.
  CPC .... *H04L 12/417* (2013.01); *H04B 2203/5445* (2013.01); *H04B 2203/5458* (2013.01); *H04L 2012/2843* (2013.01)

(58) Field of Classification Search
  CPC ........ G06F 1/3234; G06F 1/32; G06F 1/3293; G06F 1/3287; G06F 1/329; G06F 1/26; Y02B 60/42; Y02B 60/12; Y02B 60/00; Y02B 60/1282; Y02B 60/1278; Y02B 60/1285; H04L 47/10; H04L 47/12; H04L 47/20; H04L 47/24; H04L 47/32; H04L 47/38; H04L 47/70; H04L 47/72; H04L 47/74; H04L 47/78; H04L 47/80; H04L 43/00; H04L 43/50; H04L 41/04; H04B 17/00; H04B 3/46; H04B 3/54
  USPC ....... 370/252, 254, 255, 259, 260, 311, 229; 713/320, 324, 330, 340
  See application file for complete search history.

(56) References Cited

U.S. PATENT DOCUMENTS

| | | | | |
|---|---|---|---|---|
| 5,511,160 | A | * 4/1996 | Robson | G06F 15/0283 345/501 |
| 6,002,344 | A | * 12/1999 | Bandy | G06K 7/0008 340/10.2 |
| 6,008,819 | A | * 12/1999 | Robson | G06F 15/0283 715/209 |
| 7,345,998 | B2 | 3/2008 | Cregg et al. | |
| 2002/0107724 | A1* | 8/2002 | Openshaw, II | G07C 13/00 705/12 |
| 2002/0169846 | A1 | 11/2002 | Chen et al. | |
| 2003/0040813 | A1 | 2/2003 | Gonzales et al. | |
| 2003/0105769 | A1* | 6/2003 | Harris | G06Q 10/10 |
| 2005/0161507 | A1* | 7/2005 | Openshaw, II | G07C 13/00 235/386 |
| 2011/0040605 | A1* | 2/2011 | Evertz | G07C 13/00 705/12 |
| 2011/0106807 | A1* | 5/2011 | Srihari | G06F 17/30604 707/739 |

* cited by examiner

DISTRIBUTED INTELLIGENT MODULES SYSTEM USING POWER-LINE COMMUNICATION FOR ELECTRICAL APPLIANCE AUTOMATION

The present application is a U.S. national stage application of PCT/IB2013/056117 that was filed on Jul. 25, 2013, the contents thereof being herewith incorporated in its entirety.

TECHNICAL FIELD

The invention is in the field of electrical appliance automation. More precisely the automation is enabled by a plurality of electronic modules connected to the power-line network and to the electrical appliance or appliances to be subjected to automation.

BACKGROUND OF THE INVENTION

It is generally known to apply automation in the following areas of business:
- home-automation,
- industry,
- solar panels systems, and
- smart-grids.

An essential need of home-automation systems is the ability to provide a reliable system installable in every new and retrofitted house with power-line communication between each module.

Industry needs are related to the control of appliances, electrical consumption of appliances by monitoring the energy usage of the electrical appliances and avoiding of power-peaks by dispatching the load along the time.

An essential need of solar panel systems is the ability to provide a reliable communication system between the inverters. Today the industry trend is to develop micro-inverters, in the sense that each solar panel will contain its own micro-inverter. The inverters of each solar panel needs to communicate with the inverters of other solar panels.

It is know from prior art, for example from the Swiss company DigitalStrom to use power-line communication by generating voltage spikes in the switch panel and reading a current spike generated by a module close to the load. The system used by digitalStrom is described in International publication WO2011/094873 A1.

The company Insteon patented a concept of powerline and RF network in U.S. Pat. No. 7,345,998 B2. Insteon patented the concept of network of the so called "Insteon plugs" that communicate on the powerline during the zero-crossing period and use RF radio signal to couple the communication between different phases.

An other powerline communication technology is the X10 that communicates only during the zero crossing phase. It is based on messages generated by an emitter destined to a specific receiver.

Patent publication U.S. 2003/0040813 A1 speaks about distributed control of a home automation system. In this patent publication each device contains a microcontroller and a load control, and the main use of the device described in the patent publication is for lightning control. The patent publication describes the capability to store scenes in the microcontroller and be able to reproduce them with a simple trigger message. The patent publication fails to describe any power line communication and there is no mention that the system fits behind existing plugs.

Patent publication U.S. 2002/169846 describes a method to select a head cluster among nodes. The method described is based on a weighted factor: the more points the node gets, the higher is the chance to be selected as head.

Patent application EP 1978689 A1 describes a mechanism based on token weight to elect a head node. The approach is also based on a weighted mechanism, as in one of the previously mentioned patent publications with the difference that in this approach less bandwidth is needed as low-weight token are not propagated. In this approach, only one head cluster is elected, no hierarchy is present and no voting mechanism is described.

SUMMARY OF INVENTION

In a first aspect the invention provides a system that comprising a plurality of electronic modules, each one of the electronic modules configured for enabling automation of an electrical appliance to be connected to the electronic module. Each electronic module comprises at least a communication sub-part configured to enable communication over a power-line network with other modules, at least an acting means configured to act on an electrical voltage to be applied to the electrical appliance, at least a measurement means configured to measure a power consumption to be consumed by the electrical appliance, and an embedded intelligence means configured to process signals providing from or going to the at least one communication sub-part, the at least one acting means and the at least one measurement means. Each one of the plurality of electronic modules is enabled for communication with the others of the plurality of electronic modules over the power-line network by means of its at least one communication sub-part. In each one of the plurality of electronic modules the embedded intelligence means further comprises outgoing message sending means configured to send an outgoing message over the power-line network to at least one of the others of the plurality of electronic modules, ingoing message receiving means configured to receive an ingoing message over the power-line network from at least one of the others of the plurality of electronic modules, identifying means configured to identify an ingoing message relevant to the electronic module, presentation means configured to prepare a presentation message to be sent as outgoing message, the presentation message containing presentation information related to an identity of the electronic module, hierarchical ordering means configured to generate an ordered list of the plurality of modules that comprises the electronic module and the others of the plurality of electronic modules, depending on presentation information from the electronic module and presentation information received from the others of the plurality of electronic modules, and electing means for electing from the ordered list a president electronic module. The presentation means, the hierarchical ordering means and the electing means are configured such that the electing means in each of the plurality of electronic modules find the same president electronic module. The embedded intelligence means are further configured to handle information included an ingoing message sent from the president electronic module according to a determined priority protocol.

In a first preferred embodiment the at least one acting means comprises one of the list containing an ON/OFF switching means and a voltage regulation means.

In a second preferred embodiment, in any one of the plurality of electronic modules, the embedded intelligence means is further configured to read a command from an ingoing message and to adapt the processing of signals according to the command.

In a third preferred embodiment, in any one of the plurality of electronic modules, the embedded intelligence means further comprises acknowledgement means configured to prepare an outgoing message containing an acknowledgement of receipt as a result of receiving an ingoing message identified by the identifying means as being relevant to the electronic module.

In a fourth preferred embodiment, in any one of the plurality of electronic modules, the electing means are further configured to elect from the ordered list at least one vice-president electronic module, and the embedded intelligence means is further configured to handle an ingoing message sent from the at least one vice-president electronic module to the determined priority protocol in case the president electronic module is no longer functional on the power-line network.

In a second aspect the invention provided a method for organizing a hierarchy between electronic modules in a system that comprises a plurality of electronic modules according to the first aspect. The method comprises the steps of at power up of the system, each electronic modules looks for the presence of a token0 in the system, if a first module fails to find a token0 in the previous step and the first module complies to a determined priority value, the first module generates the token0, whereby the token0 confers a role of president to the first module, and a plurality of the remaining modules each generate a distinct token that confers a role of vice-president.

In a fifth preferred embodiment the module having the role of president confirms any messages transmitted through the power-line, each module having the role of vice-president configures itself to receive messages emitted by the president and to send messages to the president.

In a sixth preferred embodiment each module having the role of vice-president verifies that the president is operational.

In a seventh preferred embodiment each module having the role of vice-president assists the president in network managing tasks.

In an eighth preferred embodiment each module having the role of president or vice-president memorizes its role in view of presenting this to the other modules after an event of power failure.

In a ninth preferred embodiment any module distinct from the module having the role of president verifies whether it is in direct link with the president and if the result is positive adopts a role of repeater.

In an eleventh preferred embodiment any module distinct from the module having the role of repeater and distinct from the module having the role of president, verifies a quality of a communication signal received from the president, compares the quality of the communication with a second quality as verified by the repeater, and if the quality exceeds the second quality, issues a request for affiliation to the repeater.

In a twelfth preferred embodiment the repeater determines whether the number of module receiving its message is higher than actual state, and in case of a positive result, requests to take the role of the president.

BRIEF DESCRIPTION OF THE FIGURES

The invention will be better understood in view of the detailed description of preferred embodiments, and in reference to the drawings, wherein.

DETAILED DESCRIPTION OF PREFERRED EMBODIMENTS

In contrast to patent publication U.S. 2003/0040813 A1, in the present system each module is equipped with a distributed and local intelligence that is able to measure energy or measure any kind of other sensor connected to the module, and process this information before sharing it with the rest of the network.

In contrast to patent publication U.S. 2002/169846, the present invention differs in the sense that the other node cannot influence the selection. The inventive system is based on an election mechanism. At the start-up, a node asks if a Token0 is already present and if not it creates it. This mechanism lets to the other nodes the possibility to block this token creation. Moreover the inventive approach proposes a more hierarchical structure by having token0 and sub-token. This is very useful to speed-up a new election when token0 disappears, for instance.

The present invention provides a system composed of multiple electronic modules each communicating together with the other ones using power-line communication and enabling the electrical appliance automation. Each electronic module contains different sub-parts enabling the communication with the other modules, the ability to act on the electrical voltage (switching ON/OFF or regulation), to measure the power consumption and contains an embedded intelligence. This provides embedded intelligence to each module.

Figure 1:
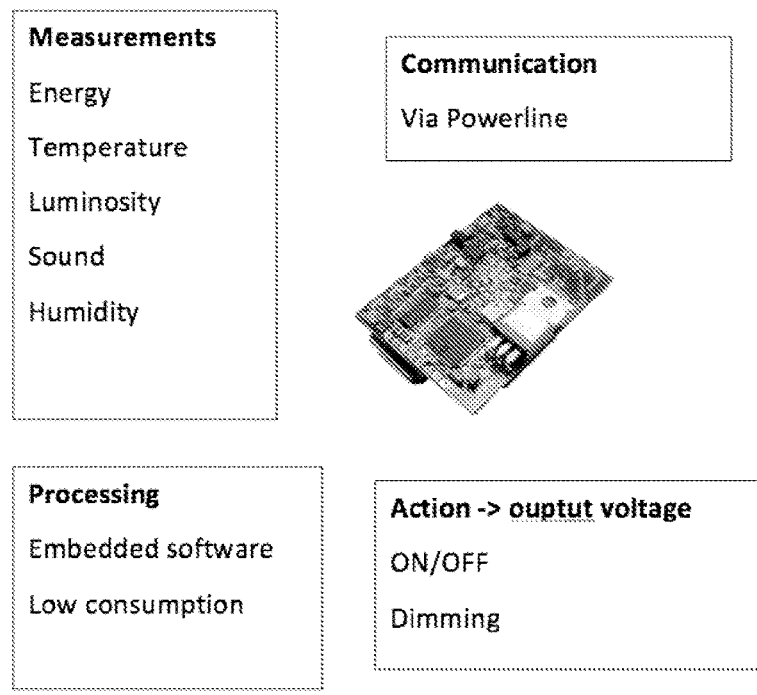
FIG. 1 represents an example module according to the invention.

FIG. 1 represents an example module according to the invention. The module may typically comprise a printed circuit board with electronic components mounted on it, whereby the electronic components and an adapted control software enable functional features such as measurement of energy, temperature, luminosity, sound and/or humidity. The processing of signals provided from measurement or communication is performed using embedded software. This manner of realizing the processing has the advantage of reducing energy consumption of the module to a minimum. FIG. 1 shows schematically one acting feature element, which is used to regulate an output voltage. This can for example be used to perform an ON/OFF function or a dimming function for an electrical appliance to be controlled. FIG. 1 further illustrates the presence of a communication element, which is used in this example to perform communication over a power line, i.e., power line communication PLC.

Figure 2:
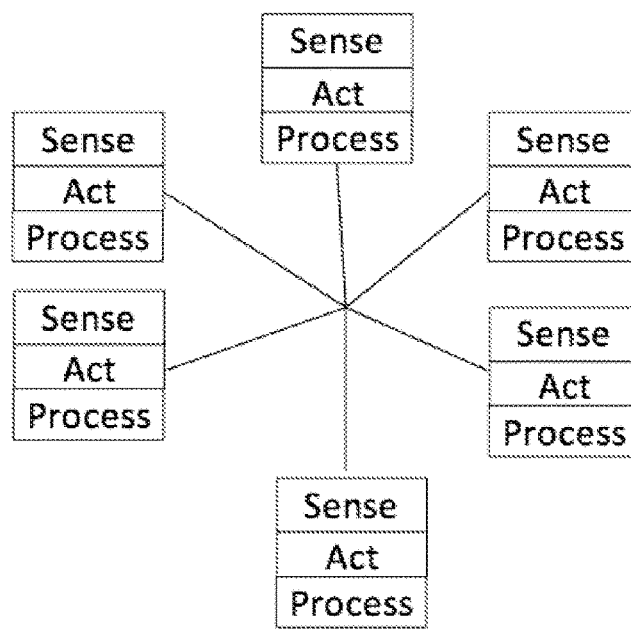
FIG. 2 illustrates a distributed communication concept between electronic through power-line communication according to the invention.

FIG. 2 illustrates an example of implementation for a distributed communication concept between electronic modules through power-line communication according to the invention. The system which in FIG. 2 is named eSMART System, comprises a plurality of module, each one being represented by a box having three functional layers: Sense, Act, and Process. The functional layers correspond to functions that may be implemented using the features presented in relation for FIG. 1.

Figure 3:
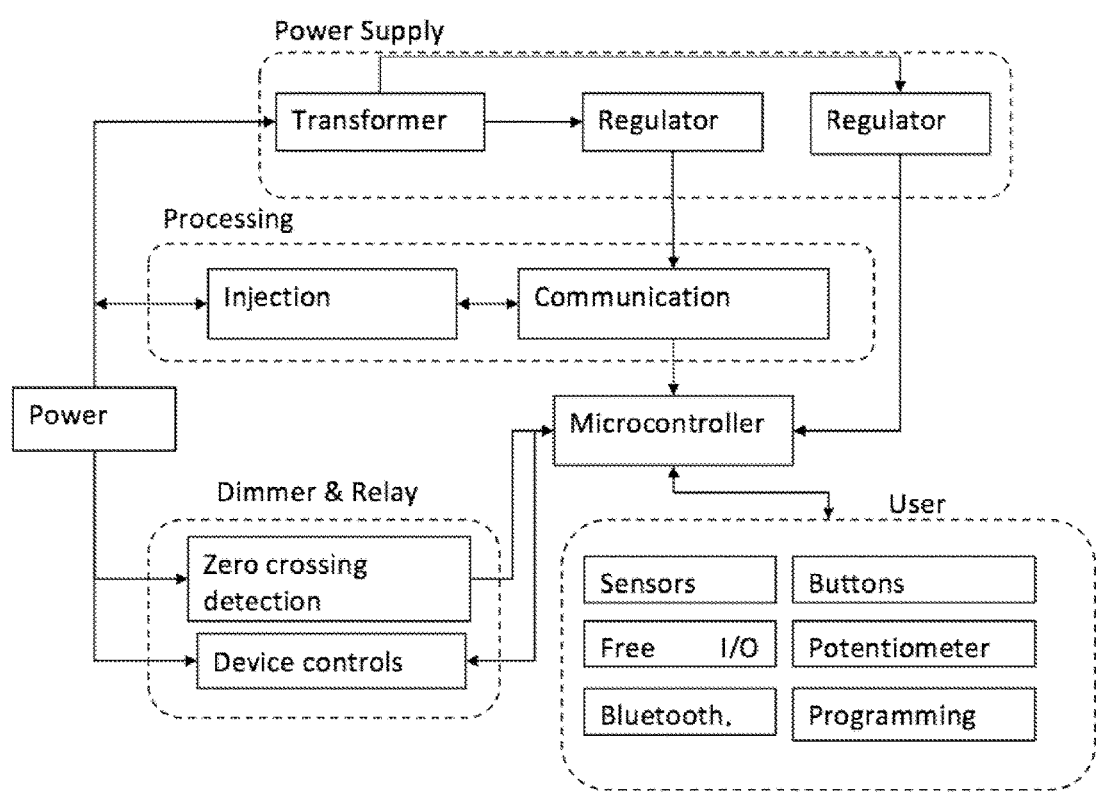
FIG. 3 contains a schematic block diagram of the electronic module according to the invention.

FIG. 3 contains a schematic block diagram of an example electronic module according to the invention, wherein individual structural elements are shown in functional groups delimitated in dashed line boxes.

A first functional group named Power supply comprises a transformer for converting for example the 230 V of the Alternating Current (AC) from a power network into appropriate voltage values.

A second functional group named Signal processing comprises and injection transformer with emitting/receiving filter, that is connected for input and output to the power network, and to a communication modem.

The communication modem is powered with the 12 V DC from the first regulator, and provides information output to a central microcontroller.

The central microcontroller is powered with the 3.3 V DC from the second regulator.

A third functional group named Dimmer & relay function comprises a zero crossing detection unit connected at its input to the power network and at its output to the central microcontroller. The third functional group further comprises a device controls unit connected at its input to the power network and also receiving signals from the central microcontroller.

A fourth functional group named User interface comprises the following elements illustrated here as example elements:
  sensors;
  buttons;
  free I/O ports;
  potentiometer;
  bluetooth, UART; and
  programming & addressing.

The embedded intelligence provides therefore flexibility and the inutility of any central infrastructure or unit dedicated to manage the communication. Each module is therefore totally independent and communicates using the powerline network. Then a novel and distributed concept of communication between each module based on messages allows providing a robust and distributed method of communication.

This novel concept of communication is inspired by human behavior during a meeting. Each module that wants to begin the communication with the other ones—new module in the network—enters in the network by introducing itself. Then, a dynamic hierarchy is generated between all modules: one and only one president is elected. 4 vice-presidents are then elected in order to manage the network if the president module fails or is no more able to administrate the system. The communication and therefore the messages exchanged between the modules can be separated in two different types: the so-called command messages and information messages.
  A command message is sent from one module directly through an other module.
  The command message contains a command that the other module will execute;
  an information message is sent from one module to the complete network of modules. The information message contains information that is sent to the rest of the network. Each module in the rest of the network will process this information thanks to their embedded intelligence—provided by a processor and algorithms—and will then execute action, an action known as acting.

Similarly to what happens during a meeting, a module will communicate information only if it is new and useful for someone else in the meeting. This is a key element in powerline communication due to the low bandwidth of the channel.

One of the main features of the information message is such that any module has access to the same information and can take a decision by itself using the embedded intelligence. During the decision process each module can share information with other modules in case of a negotiation process. This de-centralized architecture, i.e., without any fixed central unit, brings significant functionalities in the system, as listed in the following:
  a high scalability. The embedded intelligence of only one module has to be modified if new features or constraints need to be added in the system;
  a high reliability. The system does not lock itself if the embedded intelligence of any module fails. The rest of the modules—remaining modules—will process their task;
  thanks to the embedded intelligence, high-level tasks can be performed by the system. Global constraints can be affected to the system, e.g., a power-budget can be inputted in the system and modules will autonomously be able to dispatch the energy in the system;
  a high energy efficiency, as no central processing unit is needed by the system.

This particular communication topology is possible due to the electronic module, which has been developed. Moreover, this manner of managing the communication joined with power-line communication is particularly adapted because the electrical network topology can change very often. Indeed different sub-networks can be generated when electrical appliances create perturbation on the network. A dynamic organization of the communication management is therefore the key element.

Figure 4:
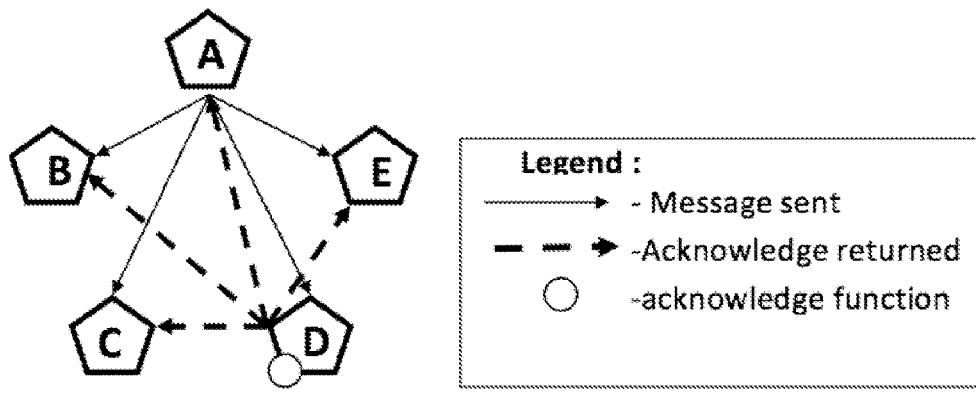
FIG. 4 illustrates an example of a standard message communication principle.

FIG. 4 illustrates an example of a standard message communication scenario in an example system according to the invention, wherein electronic modules A, B, C, D and E are interconnected over the power network (not shown in FIG. 4). The scenario involves following steps:
  electronic module A sends a message. FIG. 4 shows by means of the arrows leaving module A, that the message may be seen by any one of modules B, C, D and E;
  module D acknowledges receipt of the message to all the modules B, C, E and A as is shown by the dot representing an acknowledge function and the arrows in dashed lines leaving module D. D then processes the messages (not shown in FIG. 4);
  modules B, C and E have received a message—from A—and an acknowledgement—from D—and each of module B, C and E process these.

Figure 5:
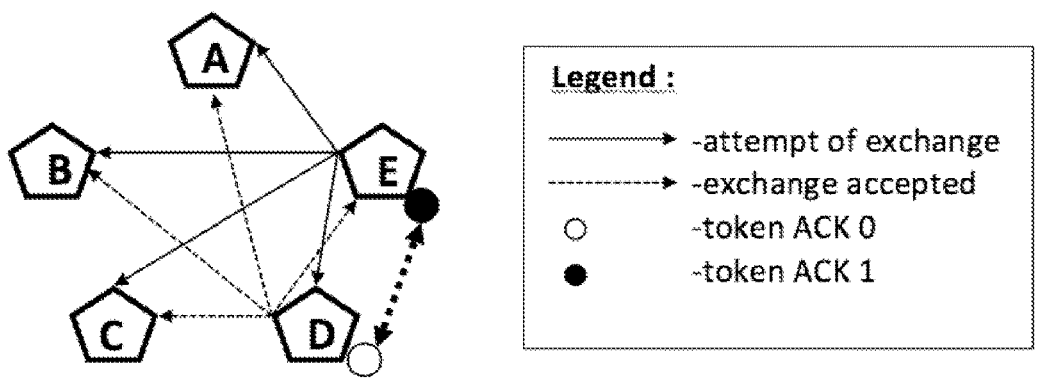
FIG. 5 illustrates an example of a high-level communication principle.

FIG. 5 illustrates an example of a high-level communication scenario in the system according to the invention, still comprising electronic modules A, B, C, D and E that are interconnected of the power network. The scenario involves the following steps:
  electronic module D attempts an exchange of a token ACK 0 against a token ACK 1. The former is represented in FIG. 4 using a disk drawn next to module D while the latter is represented using a circle drawn next to module E;
  electronic module E has the token ACK 1, and confirms the exchange;
  the remaining modules A, B and C remain observers of the exchange of tokens between modules D and E.

The present invention is more generally a novel system that gives the possibility to get information and manage appliances without any centralization. The invention leads thus to a small electronic module with an embedded processor that uses a human-similar behavior during the exchange of information.

The following paragraphs provide more details concerning the hierarchy used among the modules.

As previously mentioned, the modules organize themselves in a standalone and dynamic hierarchy, composed by a president, also known as/named token0, and many vice-presidents, known as token1, token2 . . . .

The hierarchy has the objective to manage the sensor network in order to optimize the communication in terms of:
increasing the ratio of received messages;
organizing the repeaters;
being sure that nobody is emitting too much information and is saturating the network The hierarchy is composed of a president and many vice-presidents, which behave as arbitrators on the network. Some modules can also act as message repeater in order to improve the communication.

The token0 is in charge of confirming every message that goes through the power line. Every module takes care of receiving regularly messages from the token0 and that they are able to send messages to token0

The vice-president modules are in charge of verifying the correct working of token0 and help it in the network managing tasks.

The hierarchy is generated in the following manner. During the first power-up of the system (installation) the modules look for the presence of a token0. If there are no token0 on the network, a module decides to generate this token0. This decision is based on priority value, which is computed taking into account the number of high-level interfaces connected on the module (Radio Bridge, internet access, user interfaces). The token1 and following are generated using the same mechanism.

The module memorizes their role in case of power failure.

A module decides autonomously to become a repeater if it is in direct link with token0 and detects a module trying to reach token0 without success.

A module can ask to affiliate to a repeater if the communication signal received is better than its actual link.

A repeater can ask to take the token0 if the number of module receiving its message is higher than actual state.

Token1, 2 and subsequent one will replace token0 and will thus be affected at first during a token exchange.

The present invention finds particular use in the following four fields:
home-automation applications,
industry applications,
solar panel applications, and
smart-grid applications.

In the field of home-automation systems, the present invention provides a reliable system, through the use of distributed intelligence, which is installable in every new and retrofitted house, with power-line communication between each module. The present invention provides the first home-automation system able to manage electrical appliances that can be installed in any home without any central unit.

In the field of industry application, the present invention provides that electrical appliances can be equipped with the inventive module. As previously stated, the needs of industry are related to controlling appliances and electrical consumption of appliances by monitoring the energy usage of the electrical appliances and avoid power-peaks by dispatching the load along the time. As the inventive system is totally distributed, each module can control separately the load connected to the module. The only information that should be sent on the network is the maximum power allowed.

In the field of solar panel systems, the ability to provide a reliable communication system is brought by the inventive system by means of distributed intelligence between the inverters. While in prior art the industry trend is to develop micro-inverters, in the sense that a solar panel will contain its own micro-inverter, there is a clear need for these micro-inverter to communicate between each other. The powerline communication is the most cost effective way because it avoids additional wire or radio interfaces. Therefore the present invention provides the first communication system that can be integrated directly into the (micro-) inverter and is able to manage electrical parameters of the inverter, and that can be installed in any inverter without the need for any central unit, dedicated wires or radio interfaces.

Another application of the inventive system is found in smart-grid applications. Due to the modification of the electricity distribution mechanism caused by the presence of more and more renewable energy, production will be more and more delocalized. Therefore, stability of the power systems will be affected and a top-bottom approach of electrical appliances is one of the most promising solutions in order to reduce the electrical power system perturbations and electricity cost reduction thanks to the distributed management system.

Hence the invention provides a system composed of electronic modules that for example contain each a distributed intelligence, the ability to monitor power consumption, the ability to act on the power supply and that communicate through power-line communication.

The advantages of combining the mentioned aspect are to have a fully functional system without the need of specific cable, neither central unit. This leads to a very reliable system installable in every building, be it new or existing.

The dynamic hierarchic generated by the system, thanks to its embedded intelligence allows to communicate among long distances using the power line. The power line communication channel is changing very often, without this dynamic hierarchy the communication quality cannot be assured.

The other key aspect of having intelligence in any module is that only useful information will be shared with other modules. This saves precious bandwidth, on a channel that has already very low bandwidth, e.g., at the time of filing the present patent application it is 4800 bauds.

This intelligence is also used to execute regulation or decision algorithms locally. This allows to be very flexible in the application and very fast in the decision making process.

The invention claimed is:
1. A system comprising:
a plurality of electronic devices, each one of the electronic devices configured to enable automation of an electrical appliance to be connected to the electronic device, and comprising,
a communication interface configured to enable communication over a power-line network with other electronic devices,
a voltage control device configured to act on an electrical voltage to be applied to the electrical appliance,
a measurement device configured to measure a power consumption to be consumed by the electrical appliance; and a processor device configured to process signals providing from or to the communication interface, the voltage control device, and the measurement device, wherein each one of the plurality of electronic devices is configured to communicate with the others of the plurality of electronic devices over the power-line network with the communication interface, and in each one of the plurality of electronic devices the processor device is configured to:

send an outgoing message over the power-line network to at least one of the others of the plurality of electronic devices, receive an ingoing message over the power-line network from at least one of the others of the plurality of electronic devices, identify an ingoing message relevant to the electronic device, prepare a presentation message to be sent as an outgoing message, the presentation message including presentation information related to an identity of the electronic device, generate an ordered list of the plurality of devices that comprises the electronic device and the others of the plurality of electronic devices, depending on presentation information from the electronic device and presentation information received from the others of the plurality of electronic devices, and elect from the ordered list a president electronic device, wherein at least one of the presentation information, and the ordered list include information that permits the electing performed by each of the plurality of electronic devices to find the same president electronic device, the processor device further being configured to handle information included an ingoing message sent from the president electronic device according to a determined priority protocol.

2. The system of claim 1, wherein the voltage control device comprises at least one of an ON/OFF switch and a voltage regulation device.

3. The system of claim 1, wherein in each of the plurality of electronic devices, the processor device is further configured to read a command from an ingoing message and to adapt the processing of signals according to the command.

4. The system of claim 1, wherein in each of the plurality of electronic devices, the processor device is further configured to prepare an outgoing message including an acknowledgement of receipt as a result of receiving an ingoing message identified by the identifying the ingoing message as being relevant to the electronic device.

5. The system of claim 1, wherein in each of the plurality of electronic devices, the electing performed by the processor device is further configured to elect from the ordered list a vice-president electronic device, and configured to handle an ingoing message sent from the vice-president electronic device to the determined priority protocol in case the president electronic device is no longer functional on the power-line network.

6. A method for organizing a hierarchy between electronic devices in a system according to claim 1, comprising the steps of:

at power up of the system, looking for the presence of a tokenO in the system with each electronic device, if a first electronic device from the plurality of electronic devices fails to find a tokenO in the step of looking, and the first electronic device complies to a determined priority value, generating, by the first electronic device, the tokenO, the tokenO conferring a role of president to the first electronic device, a plurality of the remaining electronic devices each generate a distinct token that confers a role of vice-president.

7. The method according to claim 6, further comprising the step of:

confirming, by the electronic device having the role of the president, any messages transmitted through the power-line, and configuring each electronic device having the role of the vice-president to receive messages emitted by the president and to send messages to the president.

8. The method according to claim 6, further comprising the step of:

verifying, by each electronic device having the role of vice-president, that the president is operational.

9. The method according to claim 6, further comprising the step of:

assisting, by each electronic device having the role of vice-president, the president in network managing tasks.

10. The method according to claim 6, further comprising the step of:

memorizing its role by each electronic device having the role of president or vice-president in view of presenting the memorized roles to the other electronic devices after power failure.

11. The method according to claim 6, further comprising the step of:

verifying by any electronic device distinct from the electronic device having the role of the president whether it is in direct link with the president and if the result is positive, adopting a role of a repeater.

12. The method according to claim 11, further comprising the steps of:

verifying by any electronic device distinct from the electronic device having the role of the repeater and distinct from the electronic device having the role of president, a quality of a communication signal received from the president, and comparing the quality of the communication with a second quality as verified by the repeater, and if the quality exceeds the second quality, issuing a request for affiliation to the repeater.

13. The method according to claim 11, further comprising the step of:

determining by the repeater whether the number of electronic devices receiving its message is higher than actual state, and in case of a positive result, requesting to take the role of the president.

* * * * *